United States Patent
Kye et al.

[11] Patent Number: 6,058,049
[45] Date of Patent: May 2, 2000

[54] REFERENCE VOLTAGE GENERATING CIRCUIT FOR FERROELECTRIC MEMORY DEVICE

[75] Inventors: Hoon Woo Kye; Woo Soon Kang, both of Kyoungki-do, Rep. of Korea

[73] Assignee: Hyundai Electronics Industries Co., Ltd., Rep. of Korea

[21] Appl. No.: 09/105,591

[22] Filed: Jun. 26, 1998

[30] Foreign Application Priority Data

Jun. 26, 1997 [KR] Rep. of Korea ............ 97-27893

[51] Int. Cl.[7] .................................................. G11C 11/34
[52] U.S. Cl. ............................. 365/189.09; 365/145
[58] Field of Search ......................... 327/589, 337, 327/536, 537; 365/226, 189.09, 145

[56] References Cited

U.S. PATENT DOCUMENTS

| | | | |
|---|---|---|---|
| 5,663,904 | 9/1997 | Arase | 365/145 |
| 5,764,561 | 6/1998 | Nishimura | 365/145 |
| 5,838,190 | 11/1998 | Lee | 327/537 |
| 5,841,725 | 11/1998 | Kang et al. | 365/226 |
| 5,850,157 | 12/1998 | Zhu et al. | 327/295 |
| 5,856,918 | 1/1999 | Soneda et al. | 363/60 |
| 5,877,650 | 3/1999 | Matsushita | 327/563 |
| 5,898,335 | 4/1999 | Mayamoto | 327/535 |
| 5,907,484 | 5/1999 | Kowshik | 363/60 |
| 5,999,439 | 12/1999 | Seyyedy | 365/145 |

*Primary Examiner*—Jung Ho Kim
*Attorney, Agent, or Firm*—Blakely Sokoloff Taylor & Zafman

[57] ABSTRACT

The present invention provides a reference voltage generating circuit for generating a stable reference voltage and having a long life time, and the reference voltage generating circuit for generating a reference voltage of a ferroelectric memory device having a plurality of bit line pairs, including: a first and second reference word line; a first dummy block comprising a plurality of switching transistors and a plurality of ferroelectric capacitors, wherein gates of the switching transistors are coupled to the first reference word line and drains/sources of the switching transistors are coupled to a bit line of one of the bit line pairs; a second dummy block comprising a plurality of switching transistors and a plurality of ferroelectric capacitors, wherein gates of the switching transistors are coupled to a second reference word line and drains/sources of the switching transistors are coupled to a bit bar line of one of the bit line pairs; and a reference plate line commonly coupled to the ferroelectric capacitors of both of the dummy blocks.

8 Claims, 8 Drawing Sheets

REFERENCE VOLTAGE GENERATING CIRCUIT FOR FERROELECTRIC MEMORY DEVICE

FIELD OF THE INVENTION

The present invention relates to a nonvolatile ferroelectric memory device having memory cells, each of which comprises a ferroelectric capacitor, and more particularly to a reference voltage generating circuit for generating a reference voltage to be transferred to a sense amplifier during data read operation of the ferroelectric memory device.

BACKGROUND OF THE INVENTION

Figure 1:
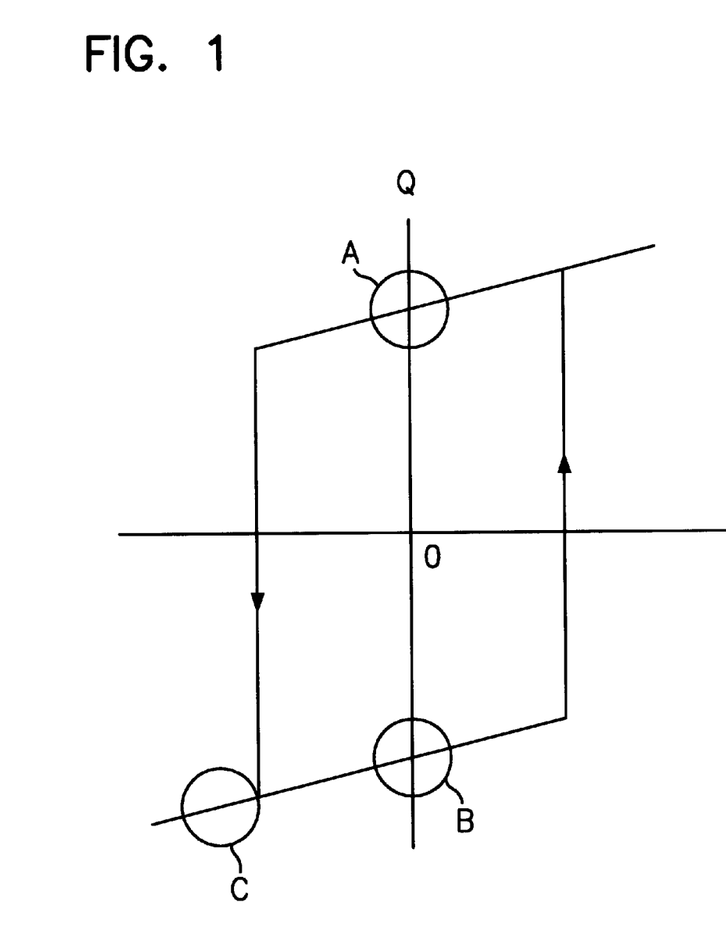
FIG. 1 a graph which shows a relationship between a voltage V and induced charges Q of the ferroelectric capacitor.

FIG. 1 is a graph which shows a relationship between a voltage V applied to terminals a and b of a ferroelectric capacitor and induced charges Q of a ferroelectric capacitor. The "ferroelectric capacitor" means a capacitor which uses ferroelectric materials as dielectric materials. As shown in FIG. 1, a ferroelectric capacitor has the hysteresis characteristic.

When the applied voltage V is 0 volt, the amount of induced charges Q is either "A" or "B". Therefore, the ferroelectric capacitor can store binary data without power supply. Because of those properties, the ferroelectric capacitor has been used in the memory cells of a nonvolatile memory device.

The amount of induced charges Q of the ferroelectric capacitor changes according to the applied voltage V. For example, when a sufficient negative voltage is applied to the ferroelectric capacitor and the ferroelectric capacitor is in the polarization state "A" shown in FIG. 1, the polarization state changes to state "C" shown in FIG. 1. Then, if this negative voltage is removed, the polarization state changes to state "B" shown in FIG. 1. The variation in the amount of induced charges ΔQ induced by the applied voltage V can be interpreted as digital data of the memory cell.

Figure 2:
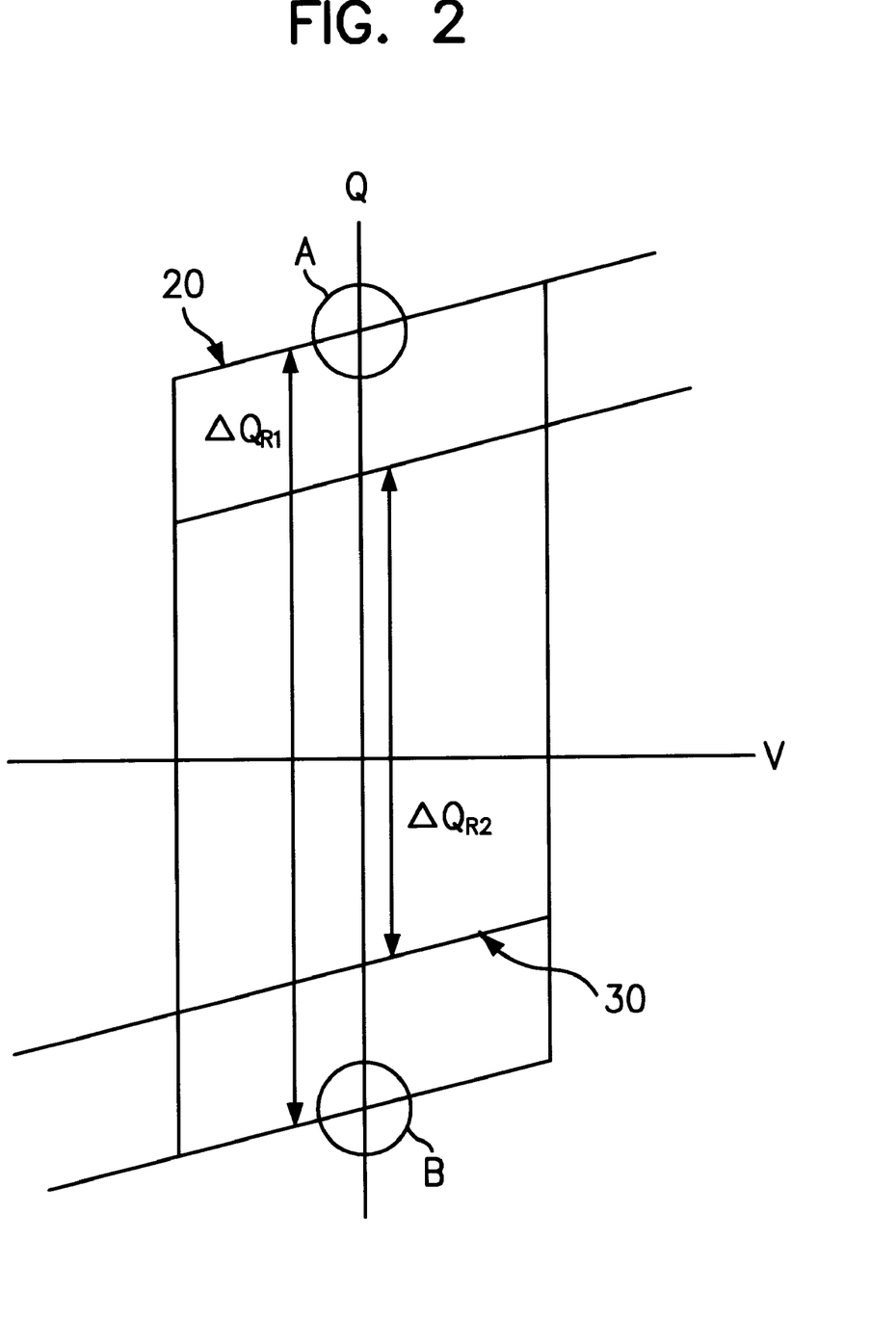
FIG. 2 is a the hysteresis curves of a non-fatigued ferroelectric capacitor and a fatigued ferroelectric capacitor.

It is already known to those having ordinary skill in the art that the ferroelectric capacitor has "fatigue" phenomenon due to the repeated switching of polarization state of the ferroelectric material according to the change of the applied voltage V. FIG. 2 shows the hysteresis curves 20 and 30 of the non-fatigued, i.e. original ferroelectric capacitor and the fatigued ferroelectric capacitor. As shown in FIG. 2, the variation in the amount of induced charges in the non-fatigued ferroelectric capacitor from point "A" to point "B" is $\Delta Q_{R1}$, while that of the fatigued ferroelectric capacitor is $\Delta Q_{R2}$, which is smaller than $\Delta Q_{R1}$. So, the sensing margin for the data from a fatigued ferroelectric capacitor is smaller than that from a non-fatigued ferroelectric capacitor, and the reliability of the memory device is also reduced. Further, because of the fatigue phenomenon of the ferroelectric capacitor, the life time of the ferroelectric memory is generally shorter than that of the DRAM or SRAM.

Figure 3:
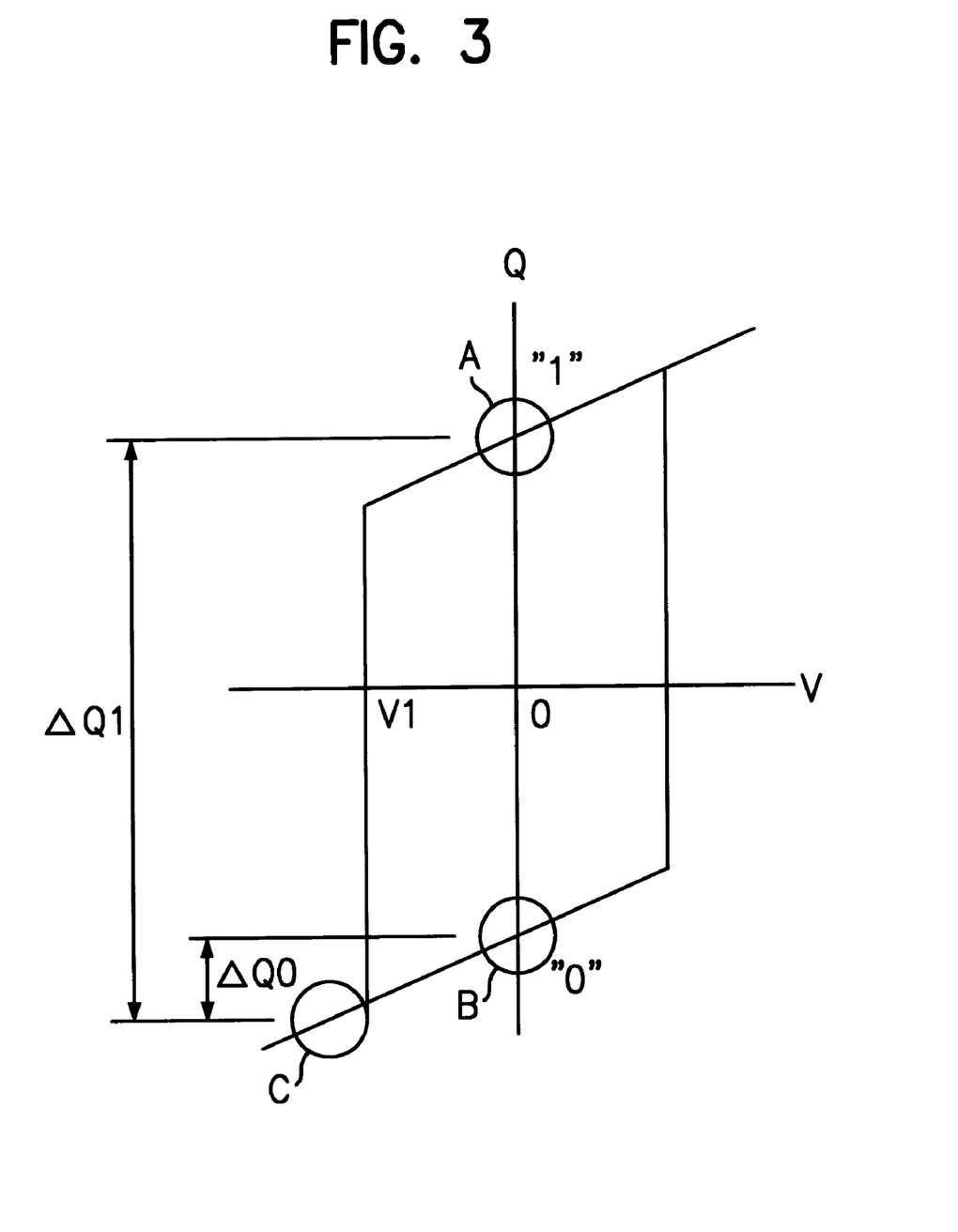
FIG. 3 is a hysteresis curve of a ferroelectric capacitor used as a data storage means.

FIG. 3 shows a hysteresis curve of a ferroelectric capacitor used as a data storage means. When the polarization state of the ferroelectric capacitor is "A", it is defined that the "1" data is stored in the ferroelectric capacitor, and when the polarization state of the ferroelectric capacitor is "B", it is defined that the "0" data is stored therein. In case the initial polarization state of the ferroelectric capacitor is "A", as a "−V1" voltage is applied to the ferroelectric capacitor, the polarization state of the ferroelectric capacitor moves to "C" and the variation in amount of the induced charges will be ΔQ1 in FIG. 3. On the other hand, in case the initial polarization state of the ferroelectric capacitor is "B", as a "−V1" voltage is applied to the ferroelectric capacitor, the variation in amount of the induced charges will be ΔQ0 in FIG. 3. This variation in the amount of induced charges ΔQ1 or ΔQ0 results in a change of a precharged voltage on a bit line by means of charge sharing of the ferroelectric capacitor with the bit line capacitor in a memory cell array. The changed voltage of the bit line is sensed and amplified by sense amplifier and becomes a digital data. In general, the sense amplifier needs a reference voltage to sense and amplify the voltage on the bit line. The reference voltage has a value which is in the middle of the voltages generated by the induced charges when the ferroelectric memory stores "1" data or "0" data. The reference voltage is generated by a dummy cell having ferroelectric capacitor.

Figure 4:
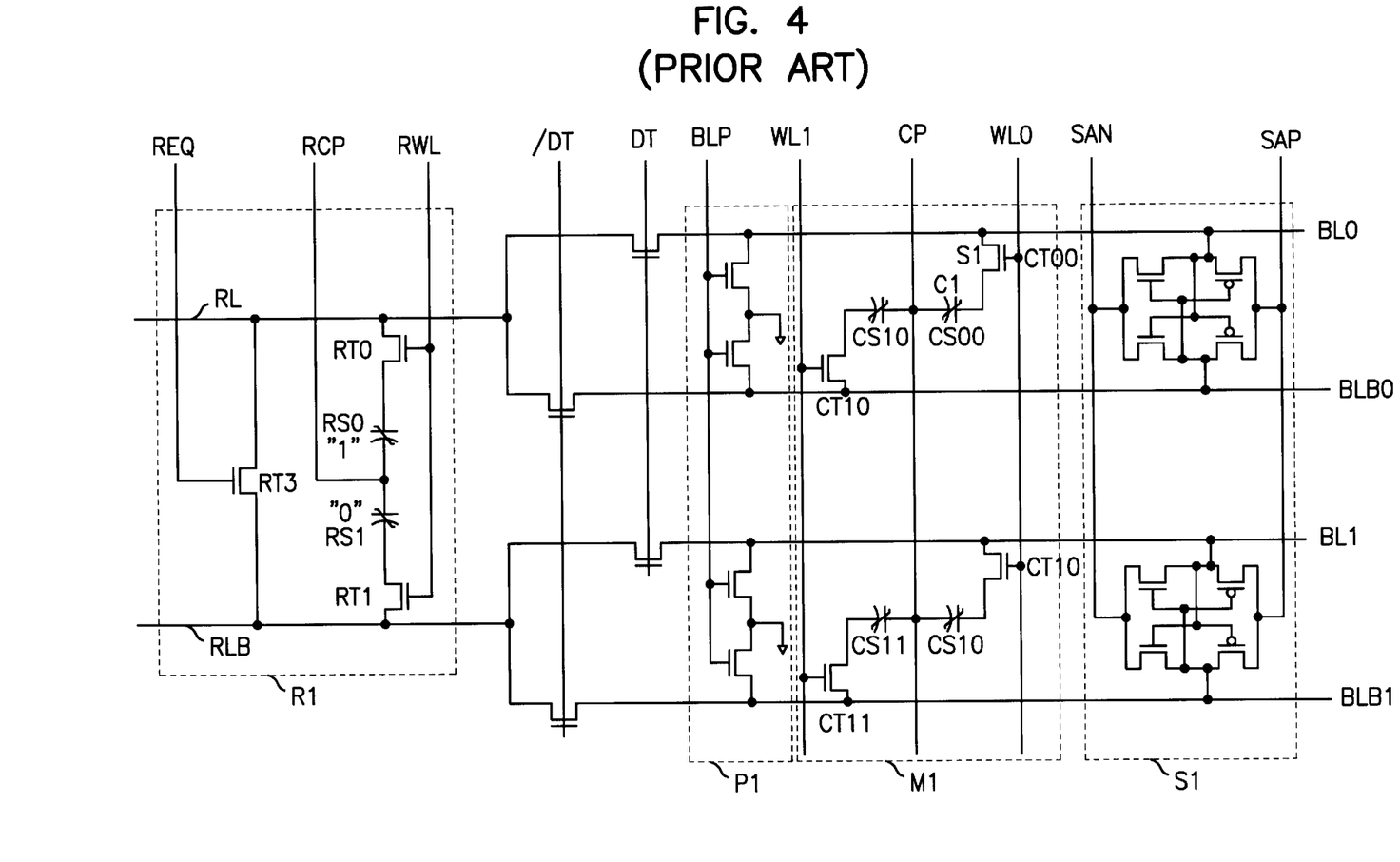
FIG. 4 is a circuit diagram of a portion of a conventional ferroelectric memory device including a conventional reference voltage generating circuit.

FIG. 4 is a circuit diagram of a portion of a conventional ferroelectric memory device having a conventional reference voltage generating circuit (published by IEEE Journal of Solid State Circuits, Vol. 31, No. 11, November 1996). The conventional ferroelectric memory device includes a sense amplifier S1 for sensing a small voltage difference between bit lines BL and BLB, a memory cell array M1 including a plurality of memory cells each of which has a switching transistor and a ferroelectric capacitor, a reference voltage generating circuit R1 for generating a reference voltage and a precharge circuit P1 for precharging the bit lines BL and BLB to a ground voltage level.

As shown in FIG. 4, the memory cell array M1 of the ferroelectric memory device is configured as a matrix with a plurality of word lines and bit lines crossing one another. The source of the switching transistor of the memory cell is coupled to the bit line BL, and the gate of the switching transistor is coupled to the word line WL0 or WL1. The one side of the ferroelectric capacitor of the memory cell is coupled to the drain of the switching transistor, and the other side of the ferroelectric capacitor is coupled to the bit bar line BLB (which is also referred to as "plate line").

Now, the operation of the reference voltage generating circuit R1 is described in detail. First of all, "1" and "0" data are respectively stored in dummy cells RS0 and RS1. In order to read the data stored in the dummy cells RS0 and RS1, the reference word line RWL is enabled to turn on the switching transistors RT0 and RT1 of the dummy cells RS0 and RS1, and the reference plate line RCP is driven to a "High" voltage level so that a negative voltage is applied to the ferroelectric capacitors of the dummy cells RS0 and RS1. As a result, voltages generated by the variations in the amount of induced charges ΔQ1 and ΔQ0 are transferred to the reference voltage lines RL and RLB, respectively. Then, the REQ signal is drived to a "High" level so that the reference voltage lines RL and RLB are equalized. Then, the DT or /DT signal is driven to "High" so that the voltage on the reference voltage line is transferred to the bit lines BL or BLB in order to be used as a reference voltage.

However, since the above mentioned conventional reference voltage generating circuit generates the reference voltage by reading the dummy cells storing "1" or "0" data, the fatigue phenomenon is occurred in the ferroelectric capacitor of the dummy cells. Therefore, the generated reference voltage is subject to change as the ferroelectric material is fatigued. This is especially true when the reference voltage generating circuit is used for a plurality of memory cells because the number of read operation is much larger than that of the normal cells. Therefore, the lifetime of the ferroelectric memory device is shorten by the reference voltage generating circuit while the memory cells are still usable.

SUMMARY OF THE INVENTION

Therefore, the present invention has been made in view of the above mentioned problem, and the present invention provides a reference voltage generating circuit for generating a stable reference voltage and having a long lifetime.

In accordance with the present invention, there is disclosed a reference voltage generating circuit for generating a reference voltage of a ferroelectric memory device having a plurality of bit line pairs, including: a first and second reference word line; a first dummy block comprising a plurality of switching transistors and a plurality of ferroelectric capacitors, wherein gates of the switching transistors are coupled to the first reference word line and drains/sources of the switching transistors are coupled to a bit line of one of the bit line pairs; a second dummy block comprising a plurality of switching transistors and a plurality of ferroelectric capacitors, wherein gates of the switching transistors are coupled to a second reference word line and drains/sources of the switching transistors are coupled to a bit bar line of one of the bit line pairs; and a reference plate line commonly coupled to the ferroelectric capacitors of both of the dummy blocks.

BRIEF DESCRIPTION OF THE DRAWINGS

A further understanding of the nature and advantages of the present invention will become apparent by reference to the remaining portions of the specification and drawings, in which.

DETAILED DESCRIPTION OF THE PREFERRED EMBODIMENT

A detailed description of an embodiment according to the present invention will be given below with reference to the attached drawings.

Figure 5:
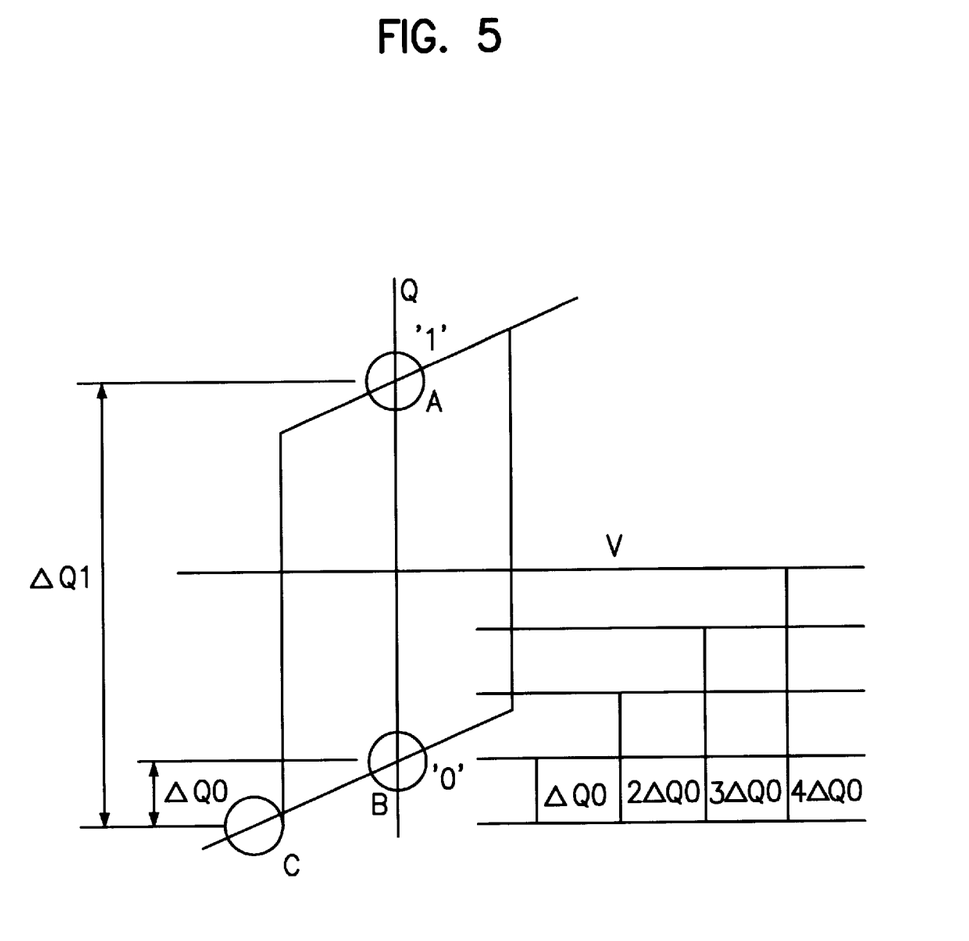
FIG. 5 is a graph which shows the mechanism of generation of a reference voltage when a negative voltage is applied to a ferroelectric capacitor according to the present invention.

Referring to FIG. 5 showing the mechanism of generation of a reference voltage when a negative voltage is applied to a ferroelectric capacitor according to the present invention. If "1" data is stored initially in the ferroelectric capacitor and a negative voltage is applied to the ferroelectric capacitor, the polarization state of the ferroelectric capacitor is changed from state "A" to state "C", so that a variation in the amount of induced charges $\Delta Q1$ is produced and the polarization direction is switched. However, if the initially stored data is "0", although a negative voltage is applied to the ferroelectric capacitor, the polarization direction is not changed while a variation in the amount of induced charges $\Delta Q0$ is still produced by the fact that the state of polarization of the ferroelectric capacitor is changed from state "B" to state "C". Since the reference voltage generally has a value corrensponding to the amount of charges of $(\Delta Q1+\Delta Q0)/2$, and this value is equal to $4\Delta Q0$, as shown in FIG. 5, the variation in the amount of induced charges $\Delta Q0$ alone without the variation in the amount of induced charges $\Delta Q1$ can be used to generate reference voltage.

Figure 6:
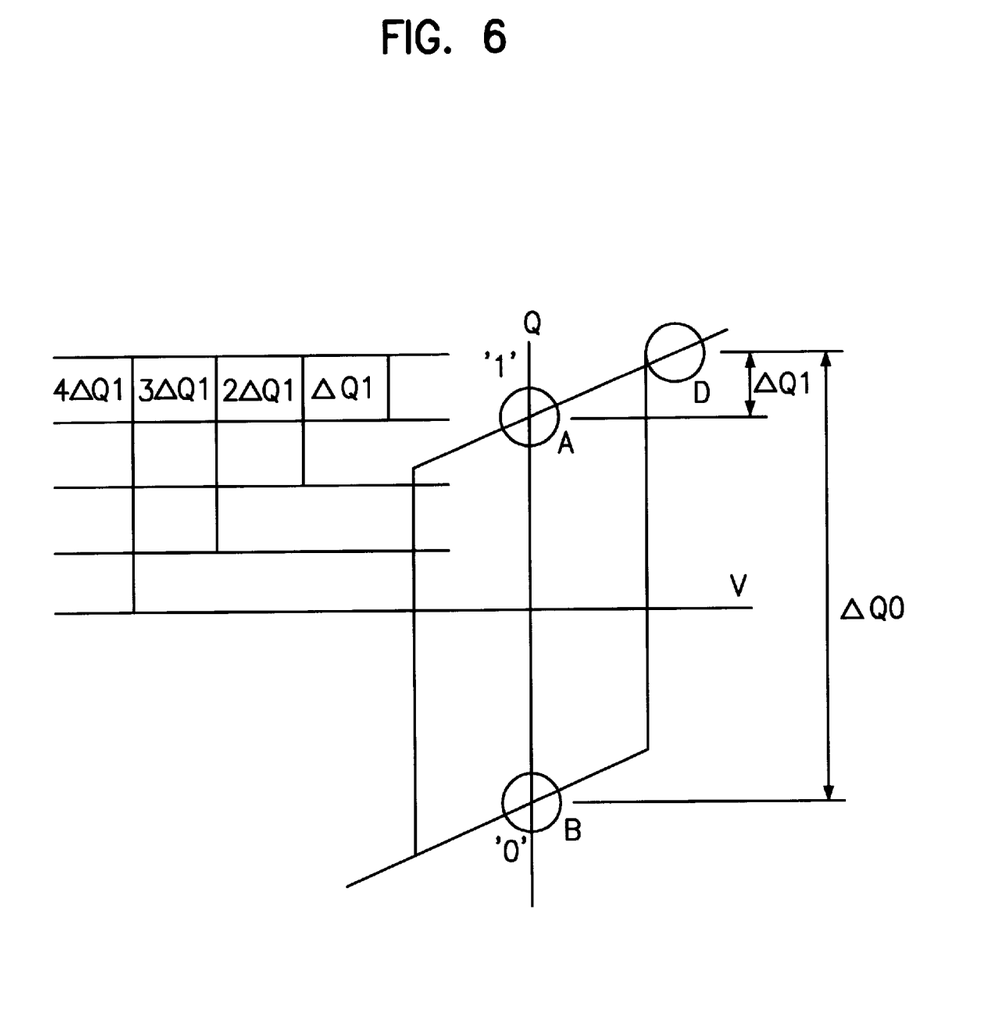
FIG. 6 is a graph which shows the mechanism of generation of a reference voltage when a positive voltage is applied to a ferroelectric capacitor according to the present invention.

Similarly, FIG. 6 is a graph which shows the mechanism of generation of a reference voltage when a positive voltage is applied to a ferroelectric capacitor according to the present invention. If "0" data is initially stored in the ferroelectric capacitor and a positive voltage is applied to the ferroelectric capacitor, the polarization state of the ferroelectric capacitor is changed from state "B" to state "D", so that a variation in the amount of induced charges $\Delta Q0$ is produced and the polarization direction is switched. However, if the initially stored data is "1", although the positive voltage is applied to the ferroelectric capacitor, the polarization direction is not changed while the variation in the amount of induced charges $\Delta Q1$ is still produced because the polarization state of the ferroelectric capacitor is changed from state "A" to state "D". Since the reference voltage generally has the value corresponding to the amount of charges of $(\Delta Q1+\Delta Q0)/2$ and this value is equal to $4\Delta Q1$, as shown in FIG. 6, the variation in the amount of induced charges $\Delta Q1$ alone without the variation in the amount of induced charges $\Delta Q0$ can be used to generate reference voltage.

In summary, in case of a ferroelectric memory which uses a negative voltage to be applied to a ferroelectric capacitor, "0" data is used to be initially stored in a ferroelectric capacitor of a reference voltage generating circuit. Further, in case of a ferroelectric memory which uses a positive voltage to be applied to a ferroelectric capacitor, "1" data is used to be initially stored in a ferroelectric capacitor of a reference voltage generating circuit.

Figure 7:
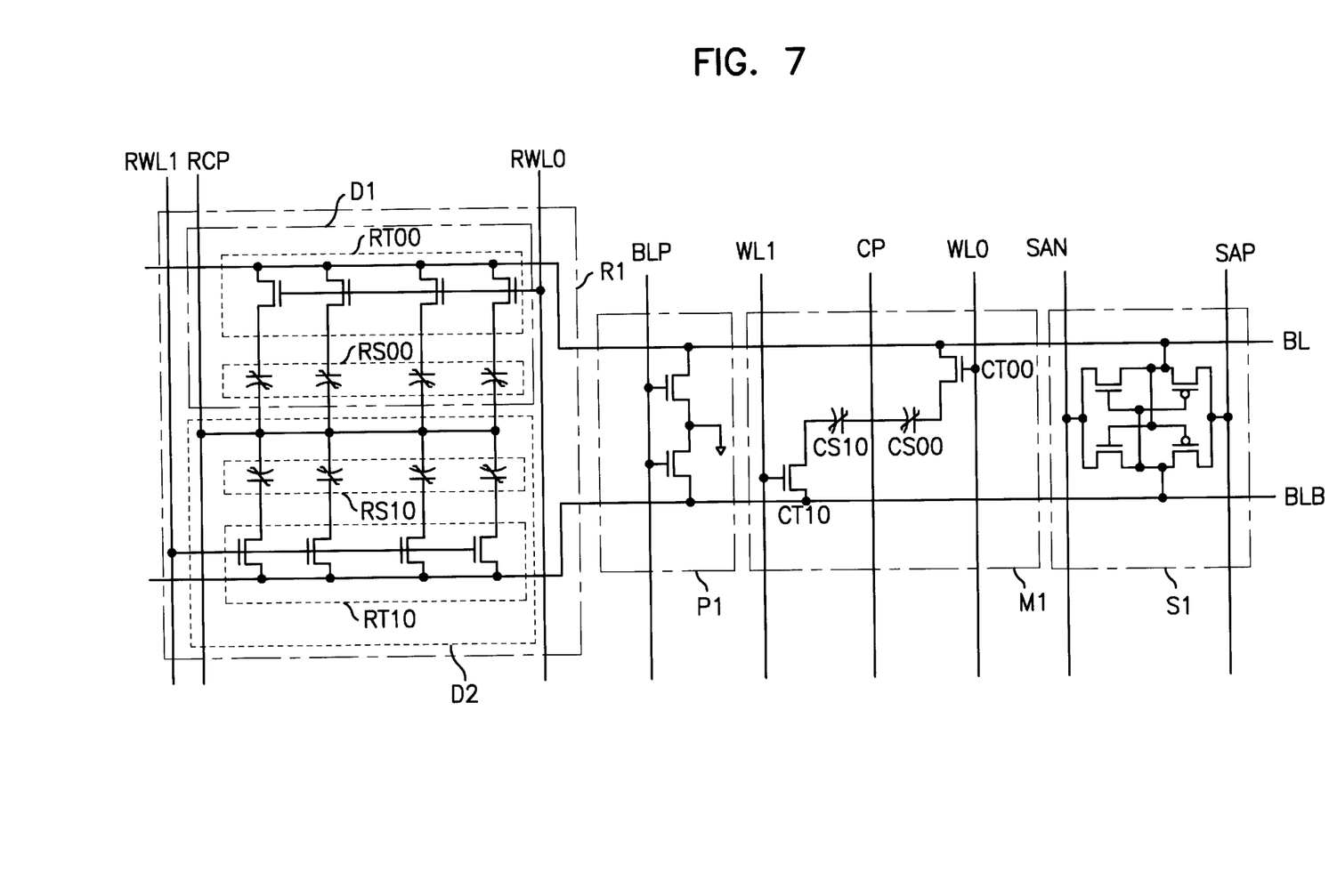
FIG. 7 is a circuit diagram of a portion of a ferroelectric memory device including a reference voltage generating circuit according to the present invention.

FIG. 7 is a circuit diagram of a portion of a ferroelectric memory device including a reference voltage generating circuit according to the present invention. As shown in FIG. 7, the ferroelectric memory device according to the present invention includes a sense amplifier S1 for sensing a voltage difference between bit lines BL and BLB, a memory cell array M1 having a plurality of memory cells each of which having a switching transistor and a ferroelectric capacitor, a reference voltage generating circuit R1 for generating a reference voltage and a precharge circuit P1 for precharging the bit lines BL and BLB to a ground voltage level.

The reference voltage generating circuit R1 includes a first dummy block D1 having four (4) switching transistors RT00 and four (4) ferroelectric capacitors RS00 and a second dummy block D2 having four (4) switching transistors RT10 and four (4) ferroelectric capacitors RS10. The gates of the switching transistors RT00 of the first dummy block D1 are coupled to a first reference word line RWL0, and the gates of the switching transistors RT10 of the second dummy block D2 are coupled to a second reference word line RWL1. Further, a reference plate line RCP is commonly coupled to the ferroelectric capacitors RS00 and RS10.

Figure 8:
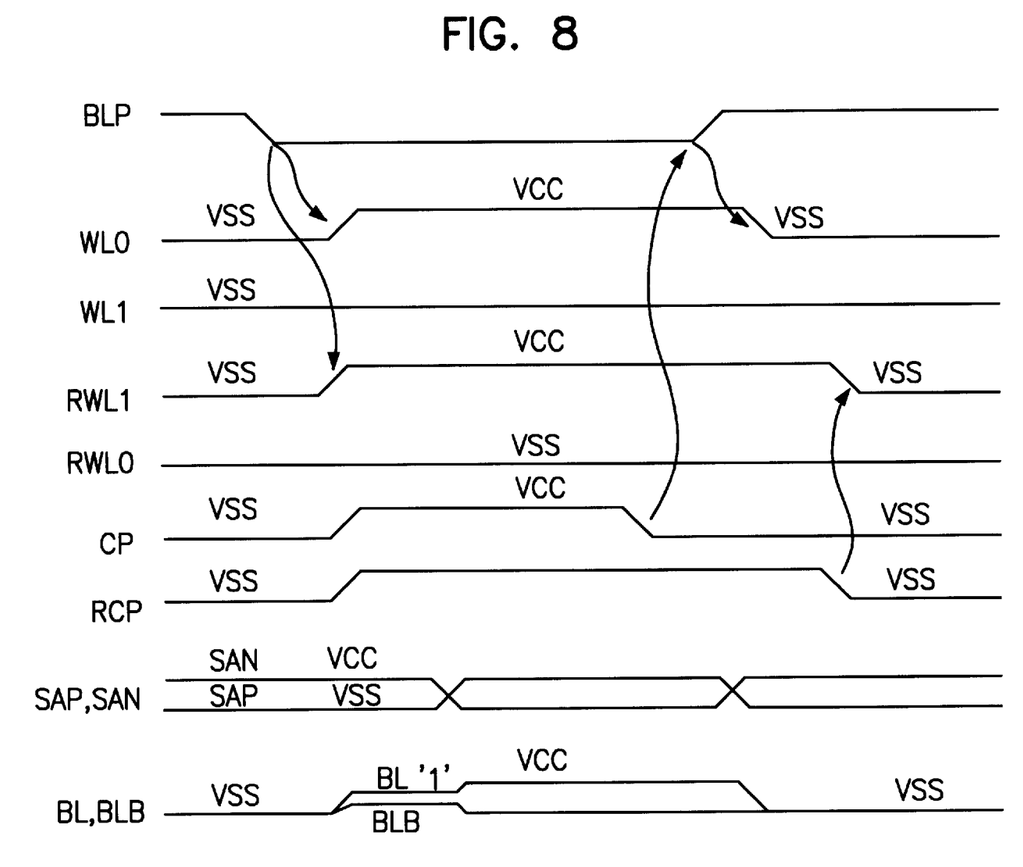
FIG. 8 is a timing diagram of the operation of the ferroelectric memory device of FIG. 7.

Now, with reference to FIG. 8 showing a timing diagram of the operation of the ferroelectric memory device of FIG. 7, the operation of the ferroelectric memory device of FIG. 7 will be described.

First, the case that "0" data is stored to the ferroelectric capacitors RS00 and RS10 of the reference voltage generating circuit R1 will be described. The bit line precharge signal BLP is maintained in "High" level so that the bit lines BL and BLB are precharged to the ground level. Then, the bit line precharge signal is driven to "Low" level so that the bit lines BL and BLB become floating in order to read a data stored in a memory cell. At this time, when the data stored in the ferroelectric capacitor CS00 of the memory cell array M1 is read out, the word line WL0 is selected to drive the switching transistor CT00 and the plate line CP is driven to high level, so that charges are induced in the ferroelectric capacitor CS00. The induced charges are shared by the parasitic capacitor of the bit line BL so that the voltage level of the bit line BL is changed by the level corresponding to the stored data. The reference voltage is needed to sense and amplify the changed voltage level of the bit line BL and is transferred to the bit bar line BLB.

In order to transfer the reference voltage to the bit bar line BLB, the switching transistors RT10 and the ferroelectric capacitors RS10 of the dummy block D2 is activated. The reference word line RWL1 is selected to turn on the switching transistors RT10. The reference plate line RCP is driven to high level so that the charges of 4ΔQ0 are induced by the ferroelectric capacitors RS10.

Then, the sense amplifier enable signals SAN and SAP are respectively drived from Vcc and Vss to Vss and Vcc in order to sense and amplify the voltage difference between the bit lines BL and BLB respectively generated by the memory cell and the reference voltage generating circuit R1. Finally, the amplified data is transferred to the output terminal.

After the read operation has been finished, the plate line is driven to low level and the bit line precharge signal BLP is driven to high level so that the memory cell becomes its initial state. Further, with the bit line precharge signal BLP being maintained in high level, the reference plate line RCP is driven to low level and the reference word line RWL1 is driven to low level so that the switching transistors RT10 are turned off and the ferroelectric capacitors RS10 of the dummy block D2 stores "0" data again.

In another embodiment of the present invention, a positive voltage can be applied to the ferroelectric capacitors. In this case, the ferroelectric capacitor RS00 and RS10 of the reference voltage generating circuit R1 initially stores "1" data. And the operation of the ferroelectric memory of FIG. 7 is similar to the operation described above except that the bit lines BL and BLB are precharged to high level and the plate line CP and the reference plate line RCP are driven to low level.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A reference voltage generating circuit for generating a reference voltage of a memory device having a plurality of bit line pairs and memory cells having a ferroelectric capacitor and a switching transistor, the reference voltage generating circuit, comprising:
    a first and a second reference word lines;
    a first dummy block comprising a plurality of switching transistors and a plurality of ferroelectric capacitors, wherein gates of said switching transistors are coupled to said first reference word line and drains/sources of said switching transistors are coupled to a bit line of one of said bit line pairs,
    a second dummy block comprising a plurality of switching transistors and a plurality of ferroelectric capacitors, wherein gates of said switching transistors are coupled to said second reference word line and drains/sources of said switching transistors are coupled to the other bit line of one of said bit line pairs; and
    a reference plate line commonly coupled to said ferroelectric capacitors of both of said dummy blocks.

2. A reference voltage generating circuit as claimed in claim 1, wherein each of said ferroelectric capacitors of said first and second dummy blocks stores "0" data when a negative voltage is applied to said ferroelectric capacitors of the memory cells for data read operation.

3. A reference voltage generating circuit as claimed in claim 1, wherein each of said ferroelectric capacitors of said first and second dummy blocks stores "1" data when a positive voltage is applied to said ferroelectric capacitors of the memory cells for data read operation.

4. A reference voltage generating circuit as claimed in claim 1, wherein said bit line pairs are precharged to a ground level when a negative voltage is applied to said ferroelectric capacitors of the memory cells for data read operation.

5. A reference voltage generating circuit as claimed in claim 1, wherein said bit line pairs are precharged to a power supply voltage level when a positive voltage is applied to said ferroelectric capacitors of the memory cells for data read operation.

6. A reference voltage generating circuit as claimed in claim 1, wherein said reference plate line is driven to a ground level when a negative voltage is applied to said ferroelectric capacitors of the memory cells for data read operation.

7. A reference voltage generating circuit as claimed in claim 1, wherein said reference plate line is driven to a ground level when a positive voltage is applied to said ferroelectric capacitors of the memory cells for data read operation.

8. A reference voltage generating circuit as claimed in claim 1, wherein the number of said ferroelectric capacitors of said first or second dummy block is determined for the sum of each induced charge from said ferroelectric capacitors of said first or second dummy block to have a half value of the sum of the induced charge from said ferroelectric capacitors of the memory cells in using a negative voltage for data read operation and the induced charge from said ferroelectric capacitors of the memory cells in using a positive voltage for data read operation.

* * * * *